US012087670B1

(12) United States Patent
Moore et al.

(10) Patent No.: US 12,087,670 B1
(45) Date of Patent: Sep. 10, 2024

(54) METAL SUBSTRATES WITH STRUCTURES FORMED THEREIN AND METHODS OF MAKING SAME

(71) Applicant: LUX SEMICONDUCTORS, INC., Albany, NY (US)

(72) Inventors: Chad B. Moore, Albany, NY (US); Graeme F. Housser, Albany, NY (US); Shane T. McMahon, Albany, NY (US)

(73) Assignee: LUX SEMICONDUCTORS, INC.

( * ) Notice: Subject to any disclaimer, the term of this patent is extended or adjusted under 35 U.S.C. 154(b) by 0 days.

(21) Appl. No.: 18/446,841

(22) Filed: Aug. 9, 2023

(51) Int. Cl.
*H01L 23/00* (2006.01)
*H01L 21/48* (2006.01)
*H01L 23/492* (2006.01)

(52) U.S. Cl.
CPC ...... *H01L 23/4922* (2013.01); *H01L 21/4803* (2013.01); *H01L 21/4878* (2013.01); *H01L 23/4924* (2013.01)

(58) Field of Classification Search
CPC ............. H01L 23/4922; H01L 21/4803; H01L 21/4878; H01L 23/4924
See application file for complete search history.

(56) References Cited

U.S. PATENT DOCUMENTS

| 6,717,071 | B2 | 4/2004 | Chang et al. | |
|---|---|---|---|---|
| 2004/0107569 | A1* | 6/2004 | Guzek | H01L 23/142 257/782 |
| 2011/0061901 | A1* | 3/2011 | Lim | H05K 1/0201 427/97.4 |
| 2012/0161190 | A1* | 6/2012 | Yao | H01L 23/3677 257/E21.597 |
| 2015/0118391 | A1* | 4/2015 | Kilhenny | H05K 1/053 362/373 |

OTHER PUBLICATIONS

JP 2008244581 A; English Translation (Year: 2008).*
JP 2013008940A; English Translation; published on Jan. 10, 2013 (Year: 2013).*

* cited by examiner

*Primary Examiner* — Pete T Lee
(74) *Attorney, Agent, or Firm* — Patrick Stanzione; Stanzione & Associates, PLLC

(57) ABSTRACT

In-Substrate Structures (ISS) and isolation regions, including, but not limited to Through Metal Vias (TMV), Dielectric Isolation Vias (DIV), and Dielectric Isolation Pockets (DIP) formed in a metal substrate to provide enhanced operations for semiconductor packages incorporating a metal substrate, and methods of making the same.

10 Claims, 9 Drawing Sheets

FIG. 1
CONVENTIONAL

3-1 silicon interposer on 2-1-1-2 organic substrate

FIG. 2
CONVENTIONAL

Standard 2.5D Architecture
Si Interposer + Organic Substrate

Glass Substrate
w/ laminate buildup layers

System-on-Foil
w/ BEoL layers

Remove Backside of Wafer

METAL SUBSTRATES WITH STRUCTURES FORMED THEREIN AND METHODS OF MAKING SAME

STATEMENT REGARDING FEDERALLY SPONSORED RESEARCH OR DEVELOPMENT

Not applicable.

COPYRIGHT NOTICE

A portion of this disclosure contains material which is subject to copyright protection. The copyright owner has no objection to the photocopy reproduction by anyone of the patent document or the patent disclosure in exactly the form it appears in the Patent and Trademark Office patent file or records, but otherwise reserves all copyright rights whatsoever. 37 C.F.R 1.71(d).

REFERENCE TO RELATED APPLICATIONS

This application claims the benefit of Provisional Application No. 63/370,812, filed Aug. 9, 2022, entitled "THROUGH METAL VIAS." The benefit under 35 USC § 119(e) of the United States provisional application is hereby claimed, and the aforementioned provisional application is hereby incorporated herein by reference in its entirety.

BACKGROUND OF THE INVENTIVE CONCEPT

1. Field of the Invention

The present inventive concept relates to semiconductor substrates and packaging having in-substrate structures (ISS), and methods of making the same. More particularly, but not exclusively, the present inventive concept relates to semiconductor substrates and packaging formed of a metal material and having through metal vias (TMV) surrounded by a dielectric material, and methods of making the same.

2. Description of the Related Art

The high cost of moving to the next semiconductor technology node (e.g., 5 nm) is changing the role of packaging in the electronics industry. With each new node, Moore's Law has historically fulfilled the economic and technological promises of density, speed, power, and cost scaling. However, these benefits are now slowing, and new packaging solutions are needed to maintain the pace of economic advantages previously met with silicon scaling. Such new solutions must provide lower latency, increased bandwidth and data rate (GHz, Gbps), lower power consumption (pJ/bit), higher routing density (# of lanes per mm/layer), and higher IO density (IO/mm$^2$).

Heterogeneous integration (HI) is expected to provide the solution. Heterogenous architectures allow the partitioning of a System-on-Chip (SoC) into chiplets, which allow for construction of SoCs that exceed maximum reticle size, reduced time-to-solution (e.g., enables die reuse), lower portfolio cost, enable optimal process technologies and smaller die for higher yield, reduce IP porting costs, and lower product SKU cost. The semiconductor industry's push for chiplet-based HI and high-density System-in-Package (SiP) has created the need for advanced packaging technologies capable of providing extreme interconnect densities needed to rival monolithic chip performance. In turn, Moore's Law of Packaging has emerged.

Figure 1:
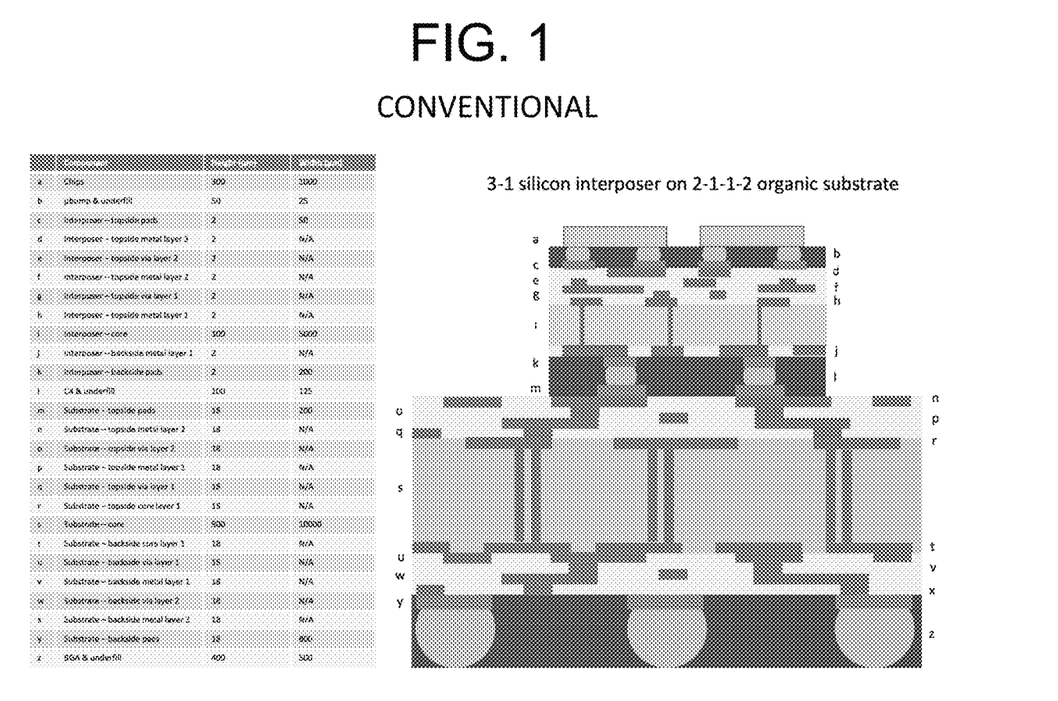
FIG. 1 illustrates a conventional 2.5D packaging architecture to form an electronic package.
Figure 2:
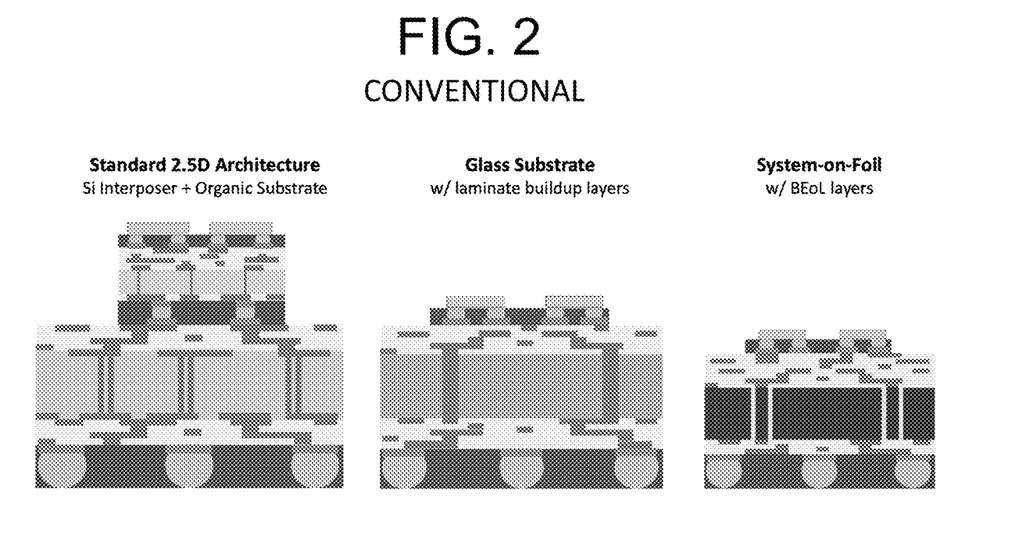
FIG. 2 illustrates: A) a conventional 2.5D stack-up; and B) a System-on-Foil electronic package.
Figure 3A:
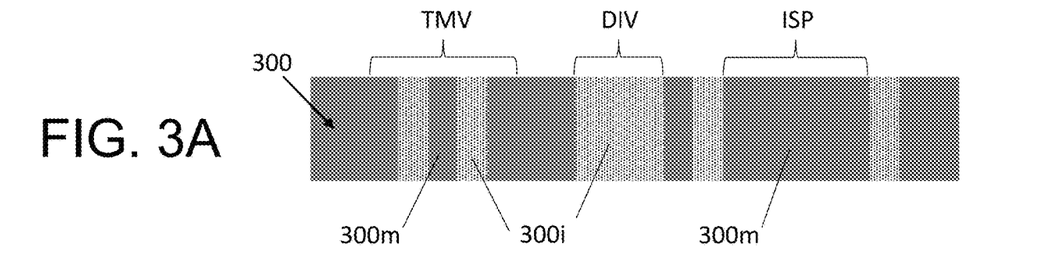
FIGS. 3A through 3D illustrate cross-sectional views of in-substrate structures (ISS) formed within the metal substrate, according to example embodiments of the present inventive concept.
Figure 3B:
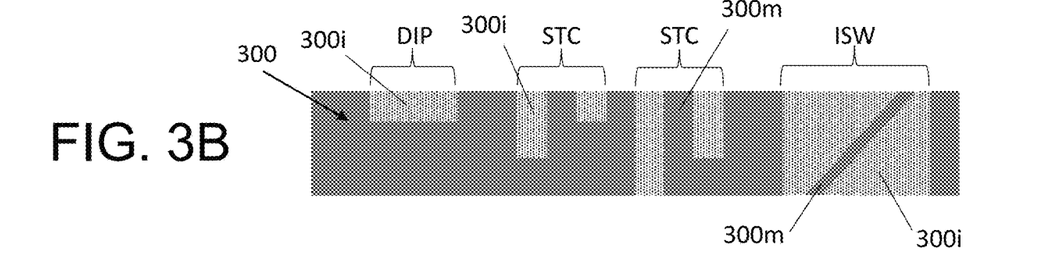
Figure 3C:
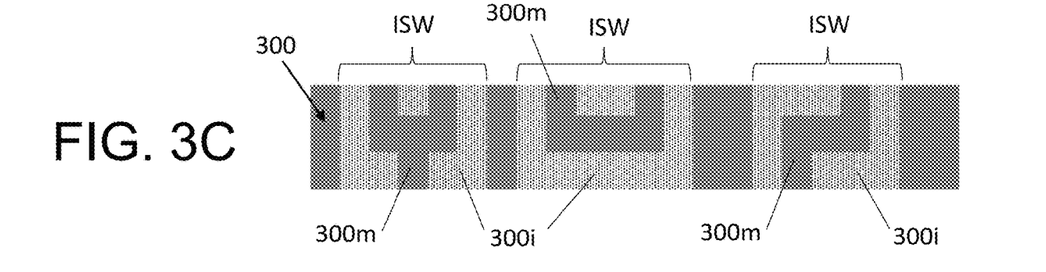
Figure 3D:
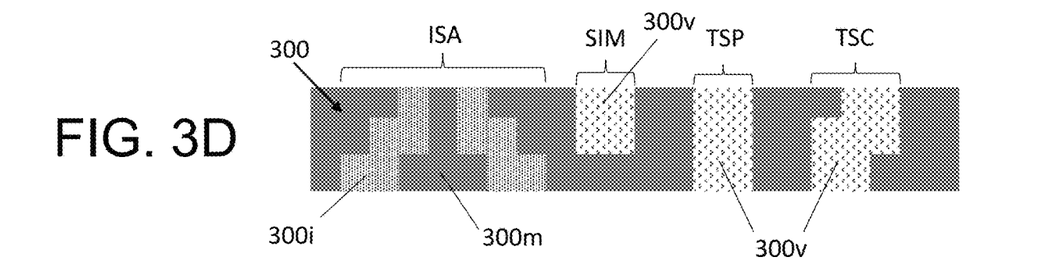

Leading semiconductor and technology companies have now incorporated advanced packaging across several of their product lines to improve chip performance and costs. Since 2015, the 2.5/3D advanced packaging architecture, illustrated in FIG. 1, has been the leading packaging approach for major semiconductor and technology companies. 2.5D packages enable multiple die to be laterally positioned on a single layer for extreme integration, with redistribution layers (RDLs) as interconnect routing between the die. In the 3D implementation, high bandwidth memory (HBM) is stacked for shorter interconnect pathways and smaller package footprints. Through silicon vias (TSVs) in a silicon interposer (aka: intermediate layer or packaging) provide vertical connectivity between the die and the substrate.

Electrically conductive, through substrate vias are required for nearly all advanced packaging applications since successfully partitioning an SoC design requires an abundance of Input/Output (I/O). This is because SoC designs comprise millions of logic gates connected by complex networks of wires, in the form of multiple buses, complicated clock distribution networks, and control signals. Standard device I/Os impose pin-to-pin delays that degrade overall circuit performance. Moreover, using time-domain multiplexing (TDM) on standard I/Os to increase the virtual pin count by running multiple signals on each I/O imposes even greater latencies that can slow I/O speeds down by a factor of 4×-32× or more. TDM approaches also result in higher power consumption. When used to drive hundreds of package-to-package connections across PCB traces between multiple chips, standard device I/O pins carry a heavy power penalty compared to connecting logic nets on a monolithic die. These requirements all lead to a demand for vias through the substrate.

There are presently three options to achieve a feedthrough within an electronic substrate: Through Package Vias (TPVs)—electrical conduits through printed circuit boards or organic substrates; Through Silicon Vias (TSVs)—electrical conduits through a silicon wafer; and Through Glass Vias (TGVs)—electrical conduits through a glass wafer or substrate. The common processing technique used to fabricate metal pins for electrically conductive through vias is an electrodeposited copper or a conductive paste screen printing process that uses gold, silver or copper mixed with a glass powder and a polymer binder to form the conductive paste.

One issue with TPVs in printed circuit boards and organic substrates is the minimum resolution that can be achieved for metal line widths and spacing. Most printed circuit board houses can pattern 4 mil (100 μm) or 3 mil (75 μm) lines and spacing and the state of the art is around 1.2 mil (30 μm), but at a very high premium price. Holes for TPVs are limited to about 6 mils (150 μm). These large features mostly limit printed circuit boards to packaged components and often do not allow for the direct integration of high resolution components, such as flip chipped die. Because of issues with electroplating copper to fill the large drilled holes in the printed circuit boards, the TPVs are usually large barrel coated holes with an opening in the center of the via. One example of a TPV is described in U.S. Pat. No. 6,717,071 "Coaxial Via Hole and Process of Fabricating the Same."

Besides the high cost of TSV, they also have low mechanical strength. Because the silicon interposers are thinned down to reveal the TSV from the backside, they are fragile and subject to cracking and breaking. When the silicon interposer package is increased in size and attached to an organic substrate, the coefficient of thermal expansion (CTE) mismatch between the silicon interposer and organic substrate can cause the bonding bumps to physically crack or break. The TSV can also warp, which can prevent fabrication or assembly, leading to phenomenon such as ball grid array (BGA) non-wets.

TGVs, and to a lesser extent TSVs, suffer from the lack of their ability to dissipate heat. The glass substrates in TGVs are insulators, thus only allowing heat to escape out of the top of the package. The TGVs are also not flexible, thus limiting their role in certain applications.

System-on-Foil, detailed in PCT/US20/54245 "System-on-Foil Device," included herein by reference, is a system-level advanced packaging technology designed to address the shortcomings of the current 2.5/3D packaging architecture. Within all advanced packages, there exists a substrate with wiring layers to allow electrical or optical communication between surface mounted electronic components and/or components disposed underneath or outside the package.

Accordingly, there is a need for through metal vias (TMVs) formed in the metal substrate of System-on-Foil to facilitate power, ground, and signals to pass between electronic components inside the package and outside the package.

Further, there is a need for dielectric isolation pockets (DIP) formed in a metal substrate to provide additional dielectric thickness to support interconnects disposed above or below the dielectric.

One issue with using a metal substrate for advanced packaging is that the electrical pads and/or solder bumps that exist within, or attached to, the wiring layers on the top or bottom of the metal substrate will capacitively couple to the substrate, thereby limiting high-frequency performance.

Accordingly, there is a need for through metal dielectric isolation vias (DIV) formed in a metal substrate of System-on-Foil to eliminate capacitive coupling between electrical structures, disposed on either side of the metal substrate, and the metal substrate. Such DIVs can also be used for optical vias and waveguides.

The power delivery network (PDN) of an advanced package is a critical design factor that must be optimized for high integrity and low impedance to maximize the performance of components inside the package.

Accordingly, there is a need for In-Substrate Planes (ISP) to be formed in a metal substrate of System-on-Foil to route power and ground within the metal substrate.

Further, there is a need for Substrate Integrated Passives (SIP) to be formed in a metal substrate of System-on-Foil to fabricate capacitors, resistors, inductors, or other passive components by using the metal core for at least a portion of the component.

Further, there is a need for In-Substrate Waveguides (ISW) to be formed in a metal substrate of System-on-Foil to route signal, power, or ground within the substrate to support high current density or impedance-controlled interconnects.

Further, there is a need for Substrate Thermal Channels (STC) to be formed in a metal substrate of System-on-Foil to provide thermal management.

Further, there is a need for Substrate Integrated Microchannels (SIM), Through Substrate Ports (TSP), and Through Substrate Channels (TSC) to be formed in a metal substrate of System-on-Foil to support microfluidics and connectors.

Finally, there is a need for In-Substrate Antennas (ISA) to be formed in a metal substrate of System-on-Foil to support antenna-in-package (AIP).

SUMMARY OF THE INVENTIVE CONCEPT

The present inventive concept relates to semiconductor substrates and packaging having metal substrates with structures formed therein, hereby referred to as in-substrate structures (ISS), and methods of making the same. More particularly, but not exclusively, the present inventive concept relates to semiconductor substrates and packaging formed of a metal material and having metal through vias surrounded by a dielectric material, thereby forming TMVs, and methods of making the same.

Additional features and utilities of the present general inventive concept will be set forth in part in the description which follows and, in part, will be obvious from the description, or may be learned by practice of the general inventive concept.

The foregoing and/or other features and utilities of the present general inventive concept may be achieved by providing a metal substrate comprising: at least one in-substrate structure (ISS) formed of the same metal as the metal substrate and extending into the metal substrate such that ends of the at least one in-substrate structure terminate at a respective plane or planes of surfaces of the metal substrate; and a dielectric material disposed between the metal substrate and the at least one in-substrate structure to isolate the at least one in-substrate structure from the metal substrate.

In an exemplary embodiment, the at least one in-substrate structure can include a through metal via (TMV).

In another exemplary embodiment, the at least one in-substrate structure can include at least one structure configured to form at least one of an in-substrate plane (ISP), a substrate thermal channel (STC), an in-substrate waveguide (ISW), an in-substrate antenna (ISA), and a substrate integrated passive (SIP).

In another exemplary embodiment, the dielectric material can be selected from a group consisting of: a) a polymer; b) a silicone; c) a glass; d) a ceramic; or any combination of a through d.

In still another exemplary embodiment, the metal substrate can further comprise: a dielectric material disposed within the metal substrate to form at least one dielectric isolation pocket (DIP); and a dielectric material disposed through the metal substrate to form at least one dielectric isolation via (DIV).

In still another exemplary embodiment, the metal substrate can further comprise: at least one of a through substrate port (TSP), a through substrate channel (TSC) and a substrate integrated microchannel (SIM).

In still another exemplary embodiment, the at least one TMV can include a plurality of electronic pins and a plurality of rectangular and complex shaped metal feedthroughs.

In yet another exemplary embodiment, the at least one TMV can include a plurality of TMVs, some of the TMVs being configured to transport electrical signals from one side of the metal substrate to the other side of the metal substrate, some of the TMVs being configured to provide a voltage from one side of the metal substrate to the other side of the metal substrate, and some of the TMVs being configured to provide a ground from one side of the metal substrate to the other side of the metal substrate.

In yet another exemplary embodiment, the at least one TMV can be configured to provide a coax feedthrough of the metal substrate.

In still another exemplary embodiment, the metal can consist of a material selected from a group consisting of: a) Molybdenum; b) Iron; c) Titanium; d) Chromium; e) Tantalum; f) Tungsten; g) Copper; h) Nickel; i) Vanadium; j) Aluminum; k) Cobolt; or any alloy comprised of a) through k).

The foregoing and/or other features and utilities of the present general inventive concept may also be achieved by providing a method of forming in-substrate structures in a metal substrate, the method comprising: ablating shapes partially into a front side of the metal substrate; filling the ablated shapes with a dielectric material; and etching away a back side of the metal substrate until the dielectric material is exposed.

In an exemplary embodiment, the ablating shapes can include ablating cylinder shapes to form through metal vias.

In another exemplary embodiment, the ablating shapes can include ablating trench shapes to form complex in-substrate structures.

In another exemplary embodiment, the ablating complex in-substrate structures can include forming at least one of a an in-substrate plane (ISP), a substrate thermal channel (STC), an in-substrate waveguide (ISW), an in-substrate antenna (ISA), and a substrate integrated passive (SIP).

In still another exemplary embodiment, the ablating shapes can include ablating pocket shapes such that the filling dielectric material therein forms at least one of a through metal dielectric isolation via (DIV) and a dielectric isolation pocket (DIP).

The foregoing and/or other features and utilities of the present general inventive concept may also be achieved by providing a method of forming in-substrate structures in a metal substrate, the method comprising: ablating at least one shape partially into a front side of the metal substrate to a predetermined depth; filling the at least one ablated shape with a dielectric material; ablating at least one shape partially into a back side of the metal substrate to a predetermined depth to meet the depth of the at least one shape ablated into the front side of the metal substrate; and filling the at least one ablated shape formed partially into the back side of the metal substrate to form at least one respective in-substrate structure through the metal substrate.

In an exemplary embodiment, the method may further comprise: ablating at least one pocket partially into a front side of the metal substrate; filling the at least one pocket with a dielectric material; ablating at least pocket partially into a back side of the metal substrate directly aligned with the at least one pocket ablated into the front side of the metal substrate until the dielectric material is reached; and filling the at least one ablated pocket formed partially into the back side of the metal substrate to form a through metal dielectric isolation via (DIV) through the metal substrate.

In an exemplary embodiment, the ablating at least one shape partially into the back side of the metal substrate to a predetermined depth is performed directly in alignment with a respective at least one shape ablated into the front side of the metal substrate until the dielectric material is reached.

In another exemplary embodiment, at least one through metal via (TMV) is formed.

In still another exemplary embodiment, the at least one respective in-substrate structure forms at least one of an in-substrate plane (ISP), a dielectric isolation pocket (DIP), an in-substrate waveguide (ISW), an in-substrate antenna (ISA), and a substrate integrated passive (SIP).

In an exemplary embodiment, the ablating shapes includes forming at least one of a through substrate port (TSP), a through substrate channel (TSC) and a substrate integrated microchannel (SIM).

BRIEF DESCRIPTION OF THE DRAWINGS

These and/or other features and utilities of the present inventive concept will become apparent and more readily appreciated from the following description of the embodiments, taken in conjunction with the accompanying drawings of which.

The drawings illustrate a few example embodiments of the present inventive concept and are not to be considered limiting in its scope, as the overall inventive concept may admit to other equally effective embodiments. The elements and features shown in the drawings are to scale and attempt to clearly illustrate the principles of exemplary embodiments of the present inventive concept. In the drawings, reference numerals designate like or corresponding, but not necessarily identical, elements throughout the several views.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures. Also, while describing the present general inventive concept, detailed descriptions about related well-known functions or configurations that may diminish the clarity of the points of the present general inventive concept are omitted.

It will be understood that although the terms "first" and "second" are used herein to describe various elements, these elements should not be limited by these terms. These terms are only used to distinguish one element from another element. Thus, a first element could be termed a second element, and similarly, a second element may be termed a first element without departing from the teachings of this disclosure.

Expressions such as "at least one of," when preceding a list of elements, modify the entire list of elements and do not modify the individual elements of the list.

All terms including descriptive or technical terms which are used herein should be construed as having meanings that are obvious to one of ordinary skill in the art. However, the terms may have different meanings according to an intention of the inventor(s), case precedents, or the appearance of new technologies. Also, some terms may be arbitrarily selected by the applicant, and in this case, the meaning of the selected terms will be described in detail in the detailed description of the invention. Thus, the terms used herein have to be defined based on the meaning of the terms together with the description throughout the specification.

Hereinafter, one or more exemplary embodiments of the present general inventive concept will be described in detail with reference to accompanying drawings.

Example embodiments of the present general inventive concept are directed to semiconductor substrates and interposer packaging having ISSs, and methods of making the same.

FIGS. 3A through 3D illustrate a few different in-substrate structures that can be formed in the metal substrate 300, according to example embodiments of the present inventive concept. The different ISSs illustrated in FIGS. 3A through 3D can be formed by effectively removing sections of the metal substrate 300 and filling these sections with dielectric material 300i or leaving these sections open 300v. One of the most important ISS structures is a through metal via (TMV). Semiconductor packaging substrates with interposer, TMV, is formed of a metal through pin material 300m surrounded by a dielectric material 300i. These TMVs transport signals from one side of the metal substrate to the other side of the substrate. High frequency 50 ohm TMV ports can be formed by controlling the size and properties of the metal pin 300m and the dielectric material 300i. In-substrate planes (ISP) can be formed through the substrates 300 by creating large complex-shaped dielectrically isolated regions within the substrate to transport power, ground or electronic signals. These ISPs can take on any shape or size and can have large sections to transport high currents through the substrate 300. Another important ISS feature is a dielectric isolation via (DIV), which is essentially a hole in the metal substrate 300 filled with the dielectric material 300i. The DIVs can serve many different functions, such as, for example electrically or thermally isolate two sections of the metal substrate 300. The DIVs can also serve to electrically separate the substrate 300 from an electronic chip that is subsequently attached to the substrate 300. Electrical isolation to a subsequent component or metal trace on the substrate 300 can also be accomplished using a dielectric isolation pocket (DIP). A DIP is similar to a DIV except it does not extend through the substrate 300 and is only a dielectric 300i filled pocket in the surface of the metal substrate 300. The term substrate can be interchangeable with the term wafer throughout the detailed description, as the two terms are commonly used interchangeably in semiconductor technology. These DIPs and DIVs can also serve as substrate thermal channels (STCs), which are used to thermally isolate one section of the substrate 300 from an adjacent section so heat can be effectively spread or channeled within the substrate 300. DIVs and DIPs can also be combined to form in-substrate waveguides (ISWs). These ISWs serve as electrical traces or conduits within the substrate 300 that can start from the top or bottom surface and go through any path within the metal substrate 300 and exit at any location or locations on either side of the substrate 300. The ISWs can be used for GND, power, or signals. The size and shape of the DIVs and DIPs used to form the ISSs can be controlled to create in-substrate waveguides that are tuned to provide a 50-ohm impedance at high frequencies. Being able to remove portions of the metal substrate 300 to different depths and filling the removed portions with the dielectric material 300i can form a slanted pin 300m or steps in the ISWs through the substrate 300. The DIVs and DIPs can also be combined to form in-substrate antennas (ISAs), which can be powered from one side of the substrate 300 and radiate out the other side of the substrate 300. After etching the metal substrates 300 and filling the etched portions with dielectric 300i to form many different types of ISSs, additional ISSs can be formed by removing portions of the substrate 300 and leaving a void 300v. There are several advantages of forming a substrate integrated microchannel (SIM), or a through substrate port (TSP), or a through substrate channel (TSC). The open voids 300v can be used as a fluidic port, as an optical port, as an open area to house a chip, to fix something to the substrate 300, or for other reasons. An SIM can also be placed over a TMV or array of TMVs to recess a chip into the substrate surface and allow the chip to communicate to the other side of the substrate for power, ground or signals.

Figure 4:
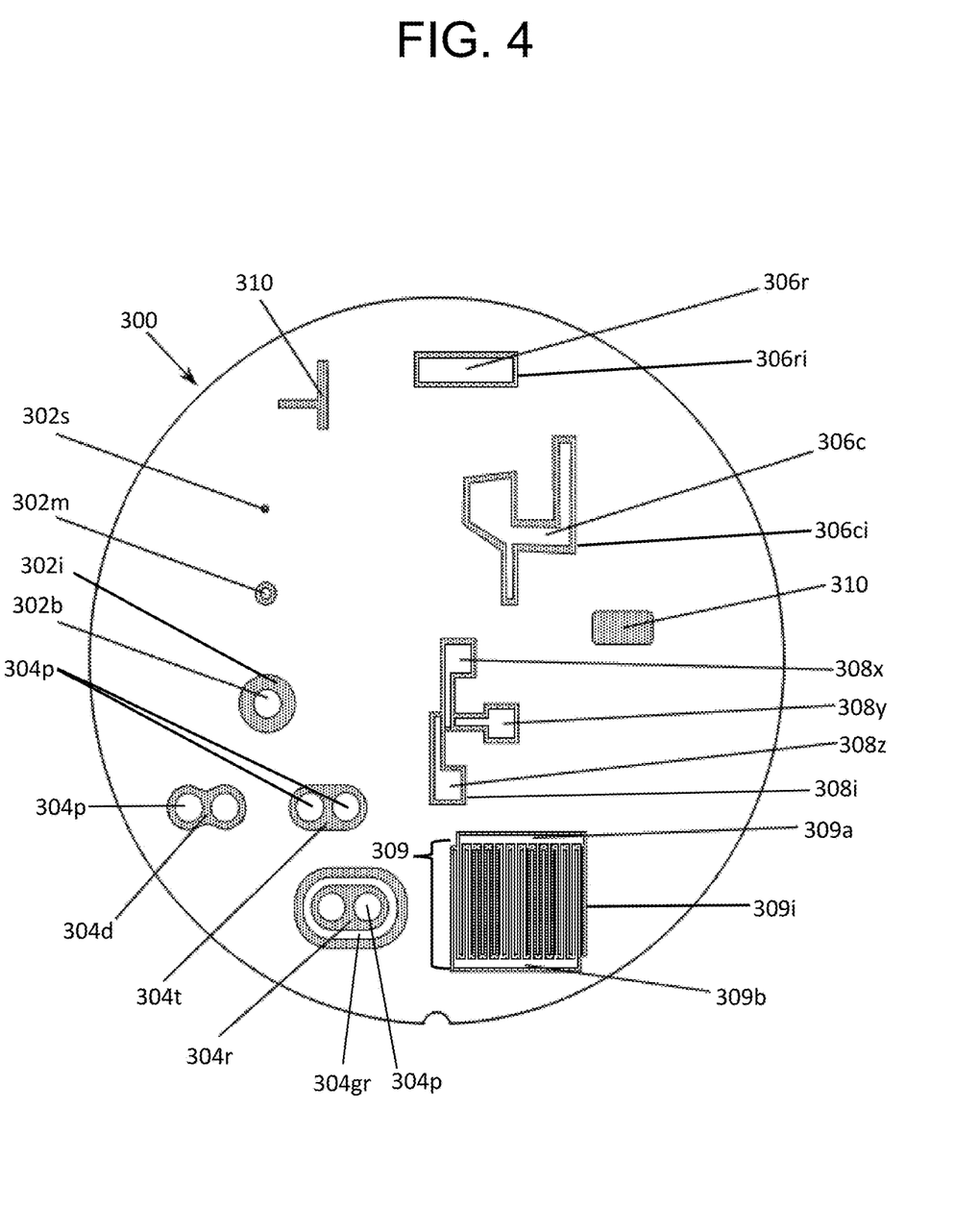
FIG. 4 illustrates a planar top view of a metal substrate including electrically isolated metal regions and dielectric isolation regions formed through the substrate, according to an example embodiment of the present inventive concept.

FIG. 4 illustrates a top view of a metal substrate 300, according to an example embodiment of the present inventive concept. The metal substrate 300 illustrated in FIG. 4 includes electrically isolated metal regions 302s, 302m, 302b, 304d, 304r, 306c, 306r, 308x, 308y, 308z and 309a-309b, and dielectric isolation regions 302i, 304i, 306i, 308i and 309i formed through the metal substrate 300, according to an example embodiment of the present inventive concept. Referring to FIG. 4, different shapes and size ISSs can be formed in the metal substrate 300, such as, for example, cylindrical TMVs in small 302s, medium 302m and large 302b sizes. In addition, coupled differential vias 304t, 304d and 304r can also be formed in metal substrates 300. The coupled differential vias 304t, 304d and 304r can be formed in the metal substrates 300 to reduce noise. Coupled differential vias, such as differential via 304r, can be formed to include pins 304p with a separate return ground 304gr. The coupled differential vias 304t, 304d and 304r can provide noise immunity. More specifically, differential lines/nets can subtract out common noise coupled on the two adjacent vias of the differential vias 304t, 304d and 304r.

Ports formed through the substrate 300, which are non-circular in shape, can also be formed, such as a rectangular port 306r or a more complex shaped port 306c. These ports 306r and 306c can be formed by etching rectangular or complex shaped trenches 306ri and 306ci, respectively, into the metal substrate 300 and then filling the trenches 306ri and 306ci with a dielectric material, which will be described in more detail below. These ports 306r and 306c can act as floating ground planes and are very important for high-frequency electronic devices. For example, many microwave devices use isolated ground planes, such as ground planes 306r and 306c. Further, many highspeed CPUs and FPGAs require multiple voltage sources with high current capabilities, which will benefit from using isolated metal substrate feedthroughs, such as ground planes 306r and 306c.

Still referring to FIG. 4, isolated metal regions 308x, 308y and 308z that share the same isolation regions 308i will have crosstalk between the isolated metal regions 308x, 308y and 308z. Sharing a same dielectric isolation region 309i will allow for capacitors 309 (with an anode 309a and a cathode 309b) to be formed within the metal substrate 300.

The metal substrate 300 can be made from many different metal compositions, such as, for example, Molybdenum, Iron, Titanium, Chromium, Tantalum, Tungsten, Titanium, Copper, Nickel, Vanadium, Aluminum, Cobalt, or any metal alloy. One of the most useful metal alloys in the hermetic seal industry is 52 alloy, which consists of 50.5% Ni with a balance of Fe. 52 alloy and usually has a little Chromium to help the bonding to the dielectric insulating glass. The high Nickel content in 52 alloy gives the substrate a low CTE, on the order of $54 \times 10^{-7}/° C.$ (5.4 ppm/° C.), which makes the substrate a good candidate for the electronic packaging industry. Molybdenum with a CTE of $48 \times 10^{-7}/° C.$ (4.8 ppm/° C.) at 25° C. and a high thermal conductivity (138 W/m K) makes the substrate an even better candidate for electronic packaging.

Figure 5A:
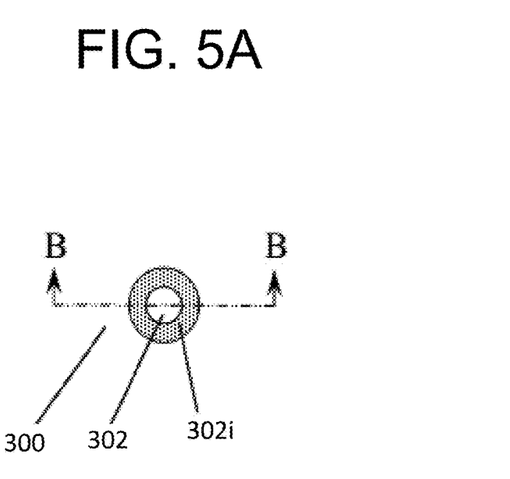
FIG. 5A illustrates a planar top view of a TMV formed in a metal substrate, according to the example embodiment of FIG. 4.
Figure 5B:
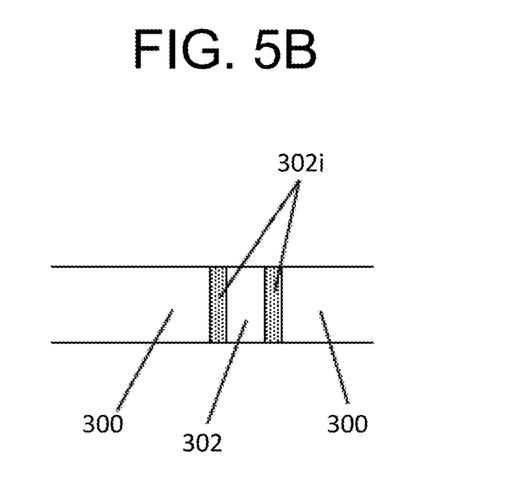
FIG. 5B illustrates a cross-sectional view of the TMV illustrated in FIG. 5A.

FIG. 5A illustrates a planar top view of a TMV according to the example embodiment of FIG. 4, and FIG. 5B illustrates a cross-sectional view of the TMV illustrated in FIG. 5A. Referring to FIGS. 5A and 5B, a standard TMV with a circular profile is illustrated. The metal substrate 300 and a center pin 302 are of the same substrate metal. More specifically, the center pin 302 is formed from the metal substrate 300 during the fabrication process, which is described in more detail with reference to FIGS. 7-12, below. It is to be noted that both ends of the metal pin 302, as illustrated in FIG. 5B, end in the same plane as the surfaces of the metal substrate 300. The metal substrate 300 and the conductive electrical pin 302 are electrically isolated from each other by an insulating dielectric material 302i. The dielectric material 302i can be composed of a polymer, silicone, glass, ceramic, or a combination of them, such as a glass or ceramic filled silicone or polymer, or a glass-ceramic. The word polymer as used herein is intended to include all carbon-based long chain molecules, like thermoplastics and thermosets, and where silicone includes all silicon/oxygen-based molecules. The key property of the dielectric isolation region is to not allow current to flow across the region.

There are many applications that require hermetic vias 302 or vias 302 that are sealed and do not leak gas from one side of the substrate 300 to the other side. Hermetic TMVs will require an inorganic dielectric material surrounding the vias, which is impervious to gas. Helium and other gases readily transport through polymer materials. A good bond between the metal 300 and dielectric material 302i, and between the metal 302 and dielectric material 302i, will be required. At least one continuous sealed ring around the center metal pin 302 and the dielectric material 302i and a sealed ring around the metal substrate 300 and the dielectric material 302i will be required for hermiticity. To reduce the stress at the dielectric/metal interface during thermal cycling a good thermal expansion match between the metal 300 and dielectric material 302i, and the metal 302 and dielectric material 302i, will be required. If the dielectric material 302i makes a strong bond with the metals 300, 302 and if their difference in coefficients of thermal expansion is less than $5 \times 10^{-7}/° C.$, then there should be no loss of hermeticity during thermal cycling. Hermetically sealed vias 302 will also be important for cleanliness in subsequent processes, especially during post vacuum based processes. If the dielectric material 302i is porous or if there are cracks in the dielectric material 302i or at the interface then contamination, moisture or gas can contaminate processing steps or can cause vacuum processes to pump down very slowly due to outgassing. Therefore, for post processing it is very advantageous to have non-porous, hermetically sealed in package ports including, but not limited to TMVs, DIVs, dielectric isolation pockets (DIPs) and in-plane ports (IPP).

Figure 6:
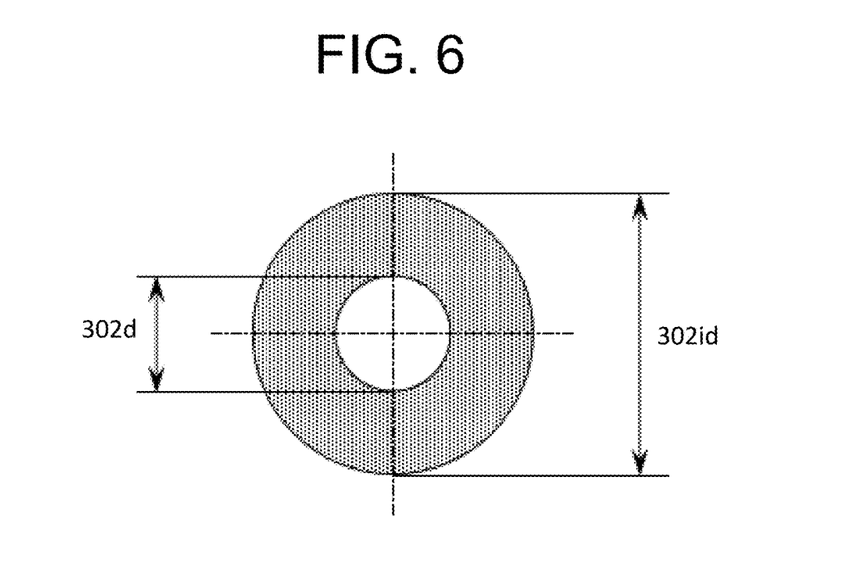
FIG. 6 illustrates a planar top view of diameter dimensions of the through metal via (TMV) hole and pin, according to the example embodiment of FIG. 5A.

FIG. 6 illustrates a planar top view of diameter 302d dimensions of the TMV pin 302d and shell 302id, according to the example embodiment of FIG. 5A. An important aspect of TMVs for high frequency applications is that the size and shape of the TMVs 302 are designed to match the 50 Ohm requirements of the electronics. To achieve the optimum 50 Ohm coax capabilities, a diameter 302d of the pin 302 and a diameter 302id of a dielectric filled hole or shell must be properly chosen. The optimum diameters of the pin 302d and shell 302id in order to generate a 50 ohm coax are also dependent on the electrical conductivity of the metal pin 302 and shell 300 (substrate), and the dielectric constant of the fill material 302i. TABLE 1 below illustrates the sizes of the hole diameter or shell 302id that houses the dielectric isolation material 302i and the metal pin 302 for TMVs, Ball Grid Array (BGA) vias and C4 vias. The results assume that the substrate 300 and metal pin 302 are composed of Molybdenum and that the dielectric isolation material 302i is polyimide with a dielectric constant of 3.2.

TABLE 1

| 50 Ohm Coax | TMV | BGA Via | C4 Via |
| --- | --- | --- | --- |
| Shell Diameter 302id (μm) | 120 | 560 | 160 |
| Pin diameter 302d (μm) | 27 | 125 | 35 |

The results in TABLE 2 below for the calculated diameters of the shell 302id and pin 302d assume that the dielectric isolation material 302i is changed to a glass with a dielectric constant of 5.1. Note that the shell diameters 302id are kept the same diameter and only the pin diameter 302d changes. For the BGA and C4 solder bumps not to capacitively couple to the metal substrate 300, the material under them must be an insulator 302i, therefore requiring the diameter of the dielectric isolation 302i to be 560 μm for BGAs and 160 μm for C4 bumps. Note that the higher dielectric constant requires a small pin diameter for a given diameter shell or a wider dielectric isolation material 302i.

TABLE 2

| 50 Ohm Coax | TMV | BGA Via | C4 Via |
|---|---|---|---|
| Shell Diameter 302id (μm) | 120 | 560 | 160 |
| Pin diameter 302d (μm) | 18.3 | 85 | 24.3 |

Figure 7:
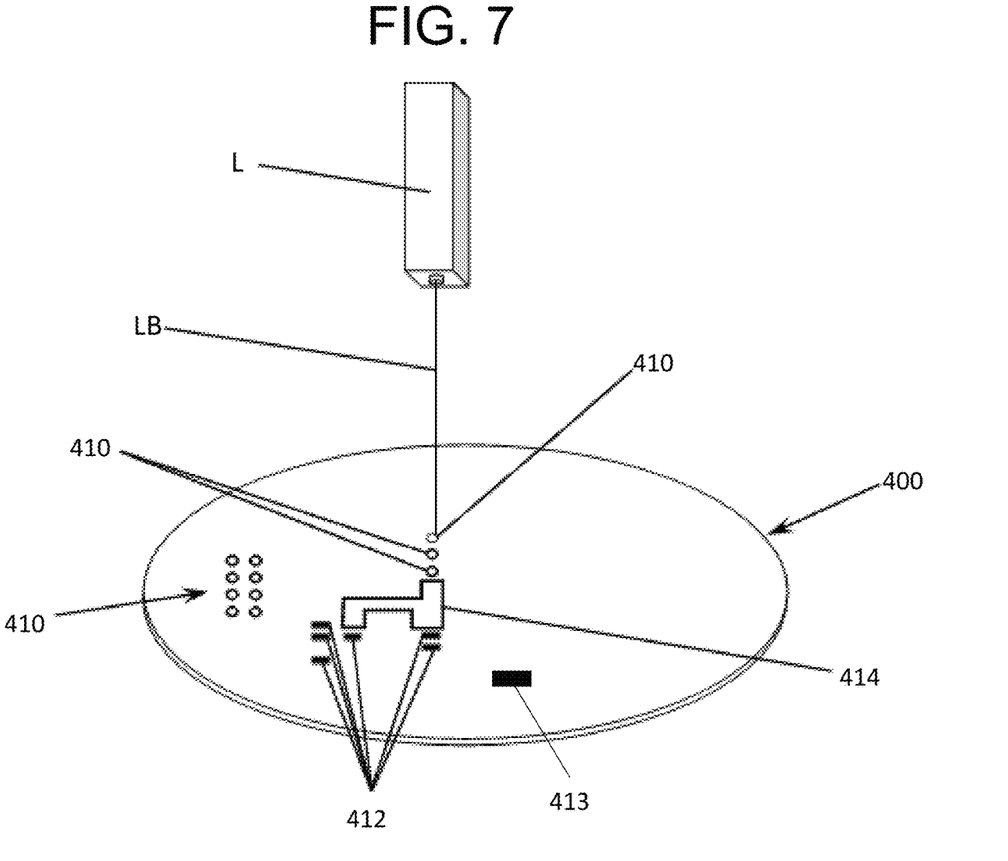
FIG. 7 illustrates a process of laser ablating regions into a metal substrate, according to example embodiments of the present inventive concept.
Figure 8:
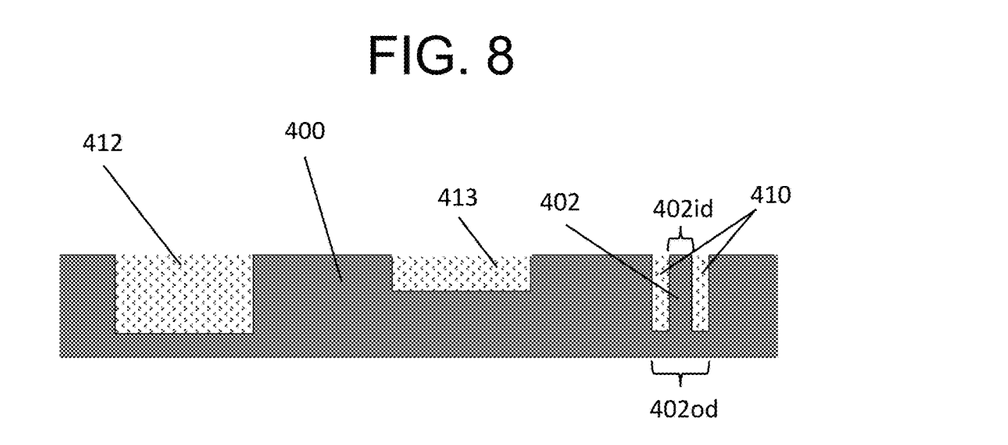
FIG. 8 illustrates a cross-section of laser ablated regions in the metal substrate to form the basis of dielectric isolation regions, according to example embodiments of the present inventive concept.

FIG. 7 illustrates a process of laser ablating/drilling regions in a metal substrate 400, according to example embodiments of the present inventive concept, and FIG. 8 illustrates a cross-section of laser ablated/drilled regions in the metal substrate 400 to form the basis of dielectric isolation regions, according to example embodiments of the present inventive concept.

Referring to FIGS. 7 and 8, a first process step to form TMV cylindrical shaped cavities 410, pockets 412 for DIVs, pockets of varying depths 413 for DIPs, and complex shaped trenches 414 for DIVs and all other ISSs is illustrated. More specifically, a laser beam LB from a laser L can be used to cut complex shapes 410-414 into the surface of the metal substrate 400. The laser beam LB can be used to drill different depths down into the metal substrate 400 to form cylindrical cavities 410, pockets 412, DIP cavities 413, and/or complex shaped trenches 414. The patterned via cavities(s) 410, pocket(s) 412, DIP cavities 413, and complex shaped trench(es) 414 can be ablated by having a stationary laser beam LB while the substrate 400 is moved around using a motor-controlled stage, or the substrate 400 can remain stationary while a Galvo (Galvanometer) can be used to scan the laser beam LB across the substrate 400 surface. To effectively cut into the metal substrate 400, it is preferred to use a pulsed laser beam LB. If the laser pulse is less than 1 to 10 picoseconds, then the metal material of the metal substrate 400 will be ablated with minimal debris around the laser cut traces. A short pulse length laser L, such as a picosecond or femtosecond laser, traditionally ablates less than 1 μm deep down into the metal substrate 400 per pulse. Therefore, the TMV holes 410 and traces 414, DIP cavities 413, and DIV pockets 412 will require many pulses to etch the required depth down into the metal substrate 400.

According to example embodiments of the present inventive concept, the cuts 410, 412, 413 and 414 are formed to extend by a predetermined depth into the metal substrate 400, as illustrated in FIG. 8. An important aspect of this example embodiment is to leave a center pin 402 in the substrate 400 which will serve as the conductive center pin 402 for the final TMV. The depth of the cut down into the metal substrate 400 can easily be controlled using a high-speed laser L, such as a picosecond laser or a femtosecond laser, by controlling the number of pulses at each cut location or passes to cut out the shape. The width of the cut or effective kerf loss can also be controlled by step scanning the laser beam LB. A TMV with a large hole diameter 402od and a small center pin diameter 402id can be accomplished by step scanning the laser and ablating concentric circles. Cutting part of the way down into the metal substrate 400 is referred to as forming a blind via.

Laser ablation is only one method of removing the material in the metal substrate 400 surface to form via cavities 410, traces 414, DIP cavities 413, and pockets 412 for subsequent dielectric material 410i, 414i, 413i, and 412i, respectively, to be filled therein. The vias 410, traces 414, DIP cavities 413, and pockets 412 can also be patterned and etched using chemicals (wet chemical etching and dry chemical etching) as well as using ions from a reactive plasma, or other methods known in the art. One problem with wet chemical etching and some reactive ion etching processes is the difficulty in creating straight high-aspect ratio channels down into the metal surface of the substrate 400. Because a reactive ion etch process etches all of the features across a large wafer at once (a parallel process), this type of process is advantageous for processing speed over a serial process such as laser ablation. However, if different depth TMVs and DIPs are required then a two layer mask process or two mask layers will be required for parallel process, such as reactive ion etching.

Figure 9:
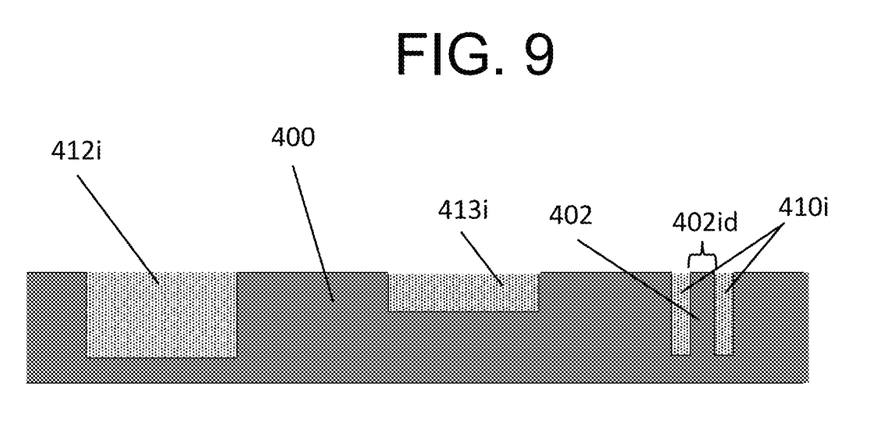
FIG. 9 illustrates a cross-sectional view of the laser drilled regions in FIG. 7 filled with a dielectric material, according to an example embodiment of the present inventive concept.

FIG. 9 illustrates a cross-section of the laser ablated regions in FIG. 8 being filled with a dielectric material. To provide brevity to the detailed description below, only the laser ablated regions 410, 413, and 412 will be described herein, although similar processes to form the complex shaped trenches 414 and corresponding dielectric material 414i can also be performed, without departing from the spirit and scope of the present inventive concept.

Referring to FIG. 9, once the via cavities 410, DIP cavities, and pockets 412 are formed in the metal substrate 400 a process step of filling the laser ablated cavities 410 (blind vias), DIP cavities 413, and pockets 412 (blind vias) with a dielectrically isolating material 410i, 413i, and 412i, respectively, can be performed. It is to be noted that there are many different dielectric materials 410i, 413i, and 412i that can be used to fill the laser ablated regions 410, 413, and 412. Such dielectric materials can range from polymers, silicone, glasses, ceramics, and combinations thereof. An inorganic material, such as glass, is used as the dielectric material 410i, 413i, or 412i to fabricate a hermetic via. To make the vias truly hermetic, not only will an inorganic dielectric material 410i, 413i, 412i be required, but the proper bonding between the metal substrate 400 and the dielectric material 410i, 413i, 412i will have to be achieved, as well as a reasonable CTE match between the metal substrate 400 and the dielectric material 410i, 4131, 412i.

The dielectric isolation material 410i, 413i, and 412i can be filled in the laser ablated regions 410, DIP cavities 413, and pockets 412, respectively, using many different techniques, including, but not limited to spin coating, screen printing, pressing, and particle settling with wafer shaking, or other methods known in the art. For inorganic isolation materials 410i, 413i, 412i the inorganic material is heat treated in order to burn off any binders and to sinter the glass, ceramic, or glass-ceramic. Because the laser ablated regions 410, 413, and 412 do not go all the way through the metal substrate 400, any filling process will be filling blind vias in the substrate surface. Filling non-through vias (or blind vias) is very different than most through via processes generally performed in the industry. In addition, having a center metal conductive pin 402 and only filling the ablated (or etched) region 410 with a dielectric material 410i is also different than other through via processes. Virtually all other through via processes either deposit Copper using an electrochemical process or a conductive paste using a screen-printing process to form the pin. Here an advantage of forming center metal conductive pins 402 from the same metal substrate 400 is that a more even flow (greater continuity) of electrical conductivity exists between a common ground 400 and the conductive pins 402. In contrast, filling blind vias by either depositing Copper by using an electrochemical process or a conductive paste using a screen-printing process results in less continuity of flow of electrical conductivity. Additionally, ablating only partially through the substrate to form the conductive pins 402 has a much greater chance of obtaining true vertical depth results.

A spinning process is a very simple process to fill the laser ablated regions 410 and pockets 412, 413 with any of the dielectric isolation materials as listed above. If a polymer is desired for the dielectric material 410$i$, 413$i$, or 412$i$ then one method is to spin coat a photosensitive positive-tone dielectric based on polybenzoxazole (PBO) like HD-8820. HD-8820 is a good dielectric polymer because it has a high glass transition temperature >300 C, a low dielectric constant of 2.94, a low dissipation factor of 0.0089, good dielectric strength of 470 kV/mm, and high volume resistivity of $3.4\times10^{16}$ U-cm. Choosing the correct spinner conditions, PBO HD-8820 can be spun on the surface of the metal wafer 400 to fill all the laser ablated regions 410 and pockets 412, 413. The HD-8820 can then be baked at the highest temperature possible in a Nitrogen atmosphere. Using a UV laser, the positive-tone photosensitive PBO can be exposed by placing the substrate 400 on a spinning chuck and scanning the laser across the surface at a very steep angle. The exposed surface can then be removed using the aqueous developer tetramethylammonium hydroxide (TMAH). The PBO polyimide can be further cured up to 350° C. to 450° C.

Glass or ceramic particles can also be filled in the laser ablated regions 410, DIP cavities 413, and pockets 412 using a wafer spinning technique. Particles loaded in a liquid binder can be spun on the surface of the substrate 400. As the liquid binder wicks down into the laser ablated regions 410, DIP cavities 413, and pockets 412 it will pull the particles with it. The glass or ceramic particles with fluid will have to be dried and potentially fired in a furnace to drive off the liquid and consolidate the glass or ceramic. Multiple spin filling and drying/sintering processes may need to be performed in order to fully fill the laser ablated channels in the surface of the substrate 400.

One popular method to fill TGVs is using conductive paste with a screen-printing process. A similar screen-printing process can be used to fill the TMVs and DIVs with a dielectric paste. The dielectric paste can be composed of glass, ceramic or a mixture of glass and ceramic particles as well as an organic vehicle and binder. A screen will have to be fabricated with openings at the locations of the laser ablated regions 410, DIP cavities 413, and pockets 412. The screen will have to be aligned to the laser ablated regions 410, DIP cavities 413, and pockets 412 and the dielectric paste can be squeegeed through the screen and into the regions 410, 413, and pockets 412 in the metal substrate 400. The metal substrate 400, with the dielectrically filled regions 410, 413 and pockets 412, can then be run through a furnace profile to burn out the organics and sinter the inorganics. Because the inorganics will shrink during burn-out and sintering a second screen-printing paste process is usually required. One issue with using a screen-printing paste process is that the ablated regions 410, DIP cavities 413, and pockets 412 that are being filled are blind, meaning they do not go all the way through the metal substrate 400. Therefore, air tends to get trapped in the ablated regions 410, 413, and pockets 412, thus creating large voids, which can have a negative effect on the electrical properties of the final TMVs. A vacuum can be used to remove the large voids in the paste filled dielectric.

Another method of filling the laser ablated regions 410, DIP cavities 413, and pockets 412 is to use a settling and vibrating process with inorganic dielectric particles, such as glass. Allowing the glass particles to settle on the metal substrate 400 and move the substrate 400 around will enable the particles to settle down into the laser ablated regions 410, 413, and pockets 412. The simplest process is to have the dielectric particles in a liquid with the laser scored metal substrate 400 in the bottom of the container. Applying ultrasonic pulses to the glass particle filled liquid will move the glass around on the metal substrate 400 surface and allow them to fall into the ablated regions 410, 413, and pockets 412. Once the ablated regions 410, 413, and pockets 412 are filled the metal substrate 400 can be carefully removed from the liquid-particle solution. Note that for settling to occur the glass dielectric particles must be denser than the liquid. The glass dielectric particles can also be mechanically moved around the surface of the metal substrate 400 to further enable them to fall into the laser ablated regions 410, 413, and pockets 412. Vibrating the metal substrate 400 will also help the glass particles fall down into the laser ablated regions 410, 413, and pockets 412 and pack tighter together, hence causing less shrinking during the sintering process.

Regardless as to which process is used to fill the laser ablated blind regions 410, DIP cavities 413, and pockets 412 with a dielectric material 410$i$, 413$i$, and 412$i$, respectively, the surface of the metal substrate 400 will have to be cleaned to remove any remaining dielectric contamination.

Figure 10:
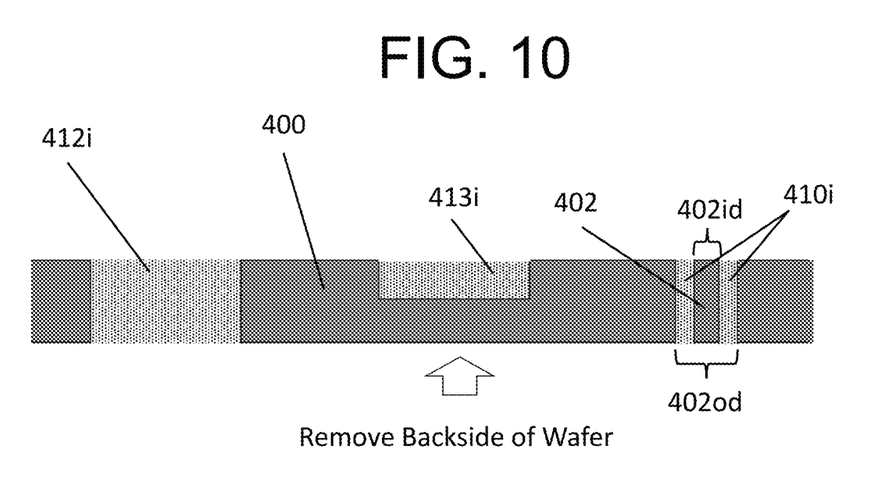
FIG. 10 illustrates a cross-sectional view of the laser ablated and dielectric material filled regions in FIGS. 8 and 9 with a backside grind to remove the metal substrate material to expose the TMVs and DIVs, according to example embodiments of the present inventive concept.

FIG. 10 illustrates a process of forming the TMVs and DIVs, according to an example embodiment of the present inventive concept. According to this example embodiment, the dielectric material 410$i$, 412$i$ is exposed on the back surface of the substrate 400 by removing the metal material from the back side of the substrate 400, which will electrically isolate the center pin 402 from the metal substrate 400, thus creating an electrical port 402 through the metal substrate 400 that is electrically isolated by the dielectric isolation material 410$i$, thus forming a TMV. Note that the top and bottom major surfaces of the metal substrate 400 and the ends of the conductive pin 402 are along the same planar surfaces. Therefore, subsequent device interconnect metallization layers on both the top and bottom surfaces of the substrate 400 can use these conductive ports 402 to carry ground, voltage, or electronic signals from one surface of the substrate 400 to the other substrate 400 surface. These electrically isolated conductive regions 402 through the metal substrate 400 can take on any shape or size, as illustrated in FIG. 4. Removing the material from the backside of the substrate 400 up to the dielectric material 410$i$ and 412$i$ can also create through metal dielectric isolation regions DIV (i.e., 412$i$) in the substrate 400. The end result of a DIV is equivalent to cutting out a chunk of the substrate 400 and filling it with a dielectric material 412$i$, thus removing the coupling capacitance of any device or pad placed above the DIV. These DIV areas can take on any shape and size and are very important for high-speed devices. Arrays of these DIVs can be made to support integration of connectors, bumps for flip-chip die attach, wire bond pads, probe pads, and Surface Mount Technology (SMT) landing pads, among other components. Note that the dielectric material 413$i$ within DIP cavities 413 is not exposed during the removal of metal material from the backside of the substrate 400, thus leaving a dielectric isolation pocket (i.e., 413$i$) on the topside of the surface. By adjusting the depth and area of the DIPs, the impedance of structures placed on top can be tuned for high speed signal transmission.

Still referring to FIG. 10, the material from the backside of the substrate 400 can be removed using any technique or method known in the art. Using a removal process, such as surface grinding or lapping, is the most straightforward and cost-effective process when parallel surfaces of the substrate 400 is required for subsequent post processing. These mechanical processes, including a post Chemical Mechanical Process (CMP), can produce a very low surface roughness required for most semiconductor-based processes, such as the damascene or dual-damascene process to create metal interconnects. A chemical removal process, vapor or liquid, can also be used to remove material from the backside of the substrate 400. A laser process can also be used to remove material from the backside of the substrate 400. A combination of several different processes can also be used to remove the material from the backside of the substrate 400 and expose the dielectric material 410i and 412i. For instance, a chemical wet etch process can be used to remove the bulk of the material from the backside of the substrate 400, followed by mechanical processes, such as a rough lap, fine lap and CMP, to flatten and planarize the substrate 400, exposing the dielectric material 410i and 412i and obtaining the desired surface roughness. If a double-sided lapping process is used to create a low surface roughness finish, then this process can also be used to remove any dielectric surface contamination from the dielectric filling process step. Therefore, creating two clean, high-quality smooth surfaces for subsequent RDLs with DIVs and TMVs interposers for 2.5/3D advanced packaging.

Figure 11:
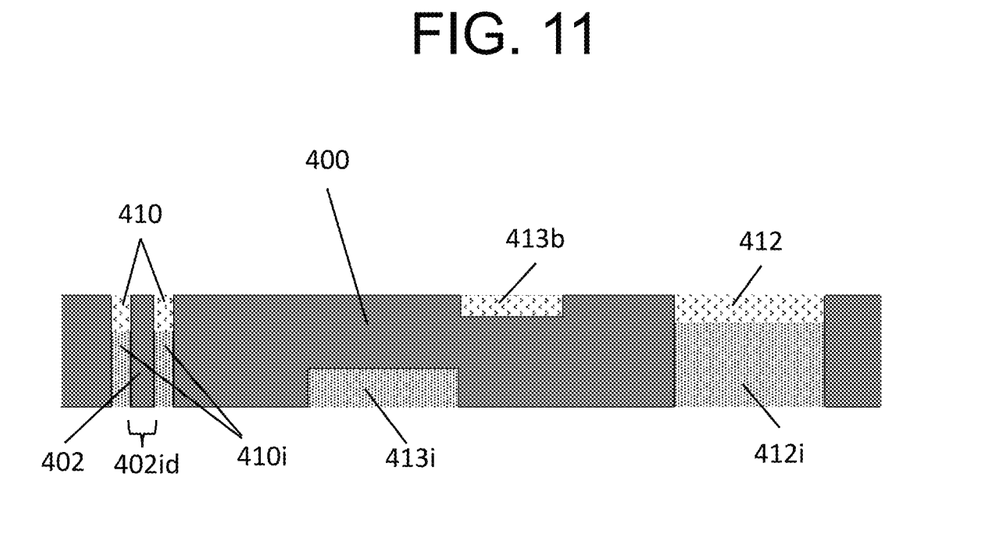
FIG. 11 illustrates a cross-sectional view of the laser ablated and dielectric material filled regions in FIGS. 8 and 9 and an additional process of laser ablating a backside of the metal substrate down to the laser ablated and dielectric material filled regions, according to another example embodiment of the present inventive concept.
Figure 12:
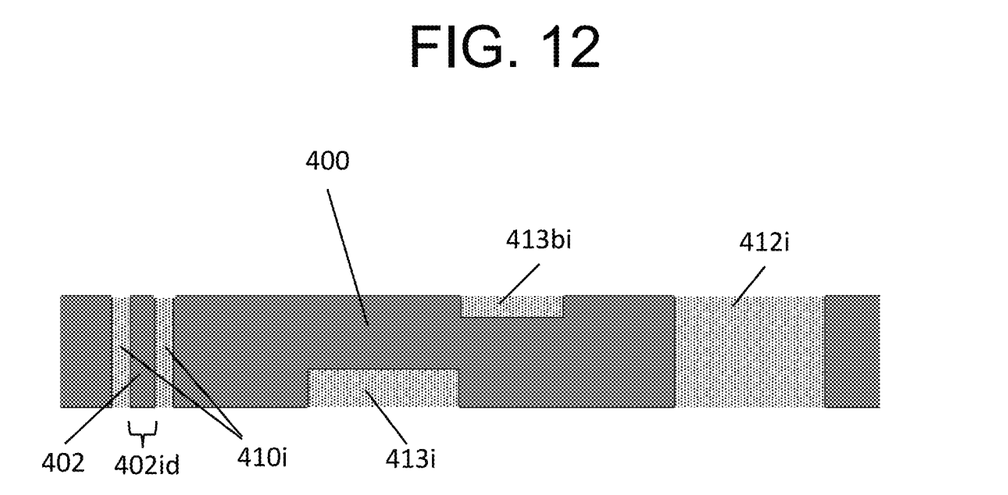
FIG. 12 illustrates a cross-sectional view of the laser ablated regions of the backside of the metal substrate as illustrated in FIG. 11, filled with a dielectric material to form TMVs and DIVs in the metal substrate, according to another example embodiment of the present inventive concept.

FIGS. 11 and 12 illustrate an alternative process of forming the TMVs, DIPs, and DIVs, according to another example embodiment of the present inventive concept. The process of forming the TMVs, DIPs, and DIVs according to this example embodiment includes turning over the metal substrate 400, which includes the dielectric material 410i, 413i, and 412i filled in the laser ablated regions 410, topside DIP cavities 413, and pocket(s) 412, as illustrated in FIG. 9, and then aligning the laser to ablate new regions 410 and pocket(s) 412 directly above the originally ablated regions 410 and pocket(s) 412 with the dielectric material 410i and 412i filled therein, respectively. Backside ablated regions 410, 412, can be aligned with topside filled dielectric regions 410i, 412i using through-wafer alignment marks previously ablated into the wafer during the topside ablation process. DIP cavity regions on the backside 413b of the metal substrate 400 can also be formed. Newly ablated regions 410 and pocket(s) 412 can be formed down into the metal substrate 400 to a point where the newly ablated regions 410 and pocket(s) 412 meet the dielectric material 410i and 412i previously formed through the front surface of the metal substrate 400. At this point, a continuous electrical pin 402 is formed. The backside ablated regions 410, 412, and 413b are then filled with dielectric material to form TMV dielectric 410i, DIVs 412i, and DIPs 413bi. An advantage of this process of ablating partially through the front surface of the substrate 400 to form the beginning of a metal pin 402, filling with dielectric, and then ablating partially through the back surface of the substrate 400 to complete the metal pin 402 is that in-substrate structures, such as TMVs and DIVs, can be formed in metal substrates twice as thick as would be possible using the drilling, filling, and backside grinding method. Forming the through vias using the two-side aligned etch and fill process does not require a thick backside grind to expose the dielectric filled material like in the drill, fill, and grind process. The double-sided drill and fill process also allows for DIPs on both sides of the wafer, which opens up a large amount of different ISSs that can be formed in the metal wafers.

The ISSs include, but are not limited to, TMVs, DIVs, ISPs, DIPs, STCs, ISWs, ISAs, SIMs, TSPs, TSCs, and SIPs.

TMVs facilitate power, ground, and signal to pass between electronic components inside the package and outside the package. The TMVs become coaxial if the metal substrate is grounded, which is often the case, and this provides lower crosstalk, lower loss, and a lower number of return vias relative to other through substrate vias, like TSVs and TGVs. The TMVs can also be fabricated in such a way as to form differential through metal vias. In this configuration, there are two dielectrically isolated signal pins, each surrounded by the same grounded metal substrate.

Figure 15:
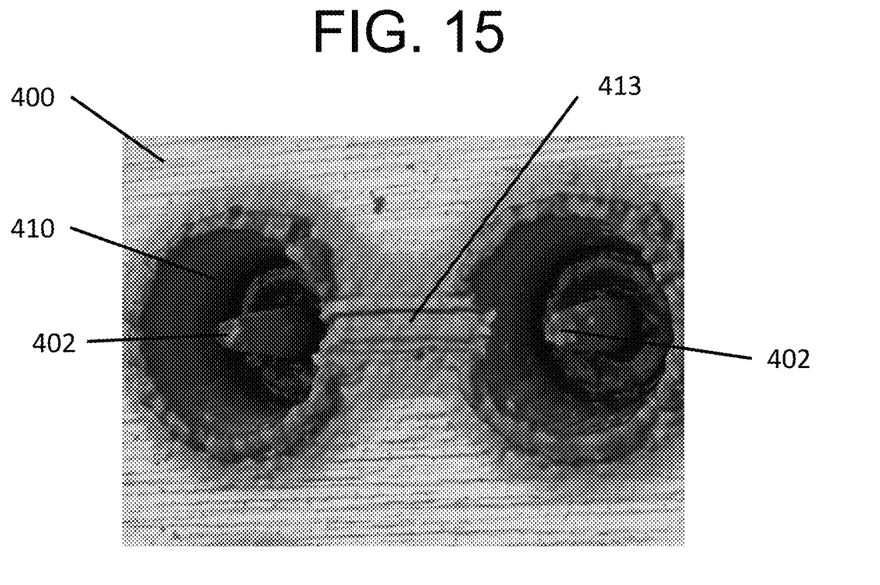
FIG. 15 illustrates a top view of a laser confocal image of two TMVs connected by a DIP, according to an example embodiment of the present inventive concept.

DIPs can be used to provide additional dielectric thickness to support patterned interconnects disposed above or below the dielectric. For example, as discussed in the background section, redistribution layers (RDLs) are a vital part of advanced packages and thick dielectric layers are often desired to support interconnects with high current carrying capability, controlled characteristic impedance, or low loss. However, there are technical and cost challenges associated with the deposition of thick dielectrics when employing conventional semiconductor fabrication processes. Alternatively, the DIP process produces an electrically isolated region between the metal substrate and patterned interconnect above, allowing for integration of impedance controlled, low loss RF interconnects without thick laminates or vacuum deposited oxides. Daisy chain or other connections can also be fabricated by connecting TMVs with DIPs that have a metal interconnect patterned atop them (FIG. 15).

DIVs can be used to produce a 'glass-like' substrate in a local region of the metal substrate to eliminate capacitive and inductive coupling between the metal substrate and electrically conductive components, like die bumps and pads, disposed on either side of the metal substrate. DIVs can also be used for optical vias and waveguides to support photonic integration.

ISPs provide bulk metal for low impedance, high integrity power and ground routing to and from any point within the metal substrate. ISPs are valuable for improving the performance of the power delivery network (PDN) of an advanced package. They can also be used in combination with other ISSs, or more commonly, a patterned interconnect disposed on either side of the metal substrate, to form an SIP, like a decoupling capacitor.

ISWs can be used to route signal, power, or ground within the substrate to support, for example, high current density or impedance-controlled interconnects that would otherwise be difficult to manufacture using conventional RDL processes.

STCs can be used to provide thermal management, for example, by directing heat from a chip into a specific direction or by blocking heat from reaching a specific component.

ISAs can be used to form an antenna-in-package (AIP). For example, RF components such as transceivers, power amplifiers (PA), low-noise amplifiers (LNA), switches, filters, power management integrated circuits (PMIC), etc., can be mounted to RDLs patterned on one side of the metal substrate and cause a signal to radiate through the metal substrate using ISAs.

SIPs, by using the metal core for at least a portion of the component, can be used to as built in capacitors, resistors, inductors, or other passive components to support signal routing, power delivery, and other electrical functions.

Lastly, SIMs, TSPs, and TSCs can be used to support microfluidics and connectors.

Referring to FIGS. 11 and 12, once the newly ablated cavities 410 and pocket(s) 412 are formed into the back surface of the substrate 400 to meet the corresponding previously formed topside dielectric material 410*i* and 412*i* additional dielectric isolation material 410*i*, 413*bi*, and 412*i* can be filled in the laser ablated regions 410, backside DIP cavity 413*b*, and 412 according to any of the processes mentioned above with respect to FIG. 9. With this process as illustrated in FIGS. 11 and 12 a high degree of vertical depth of TMVs and DIVs is obtained, which leads to thicker, and thus more rigid substrates.

Example Products of the Present Inventive Concept

Figure 13:
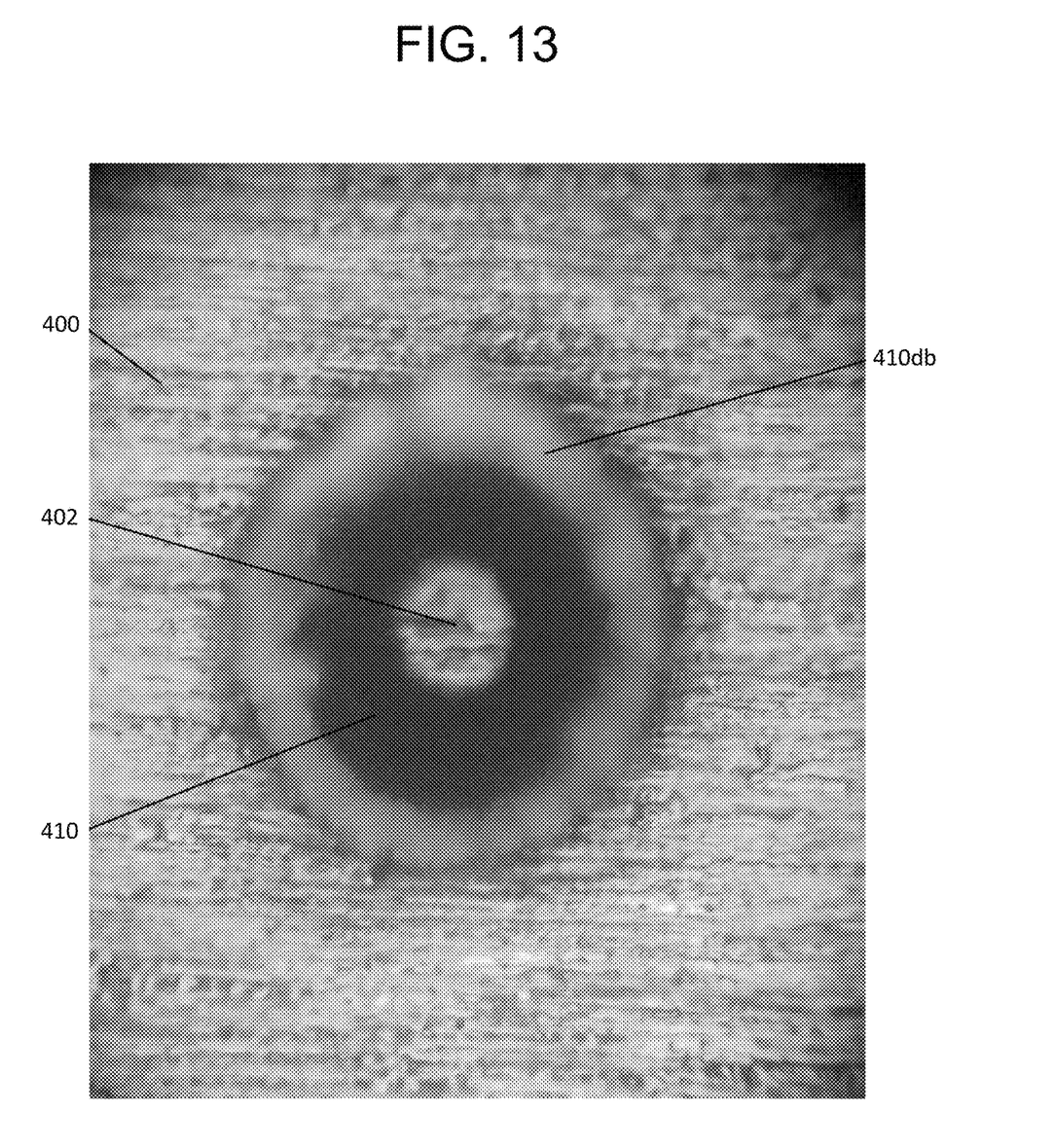
FIG. 13 illustrates a microscope image of a laser ablated circular blind via in a metal substrate, according to an example embodiment of the present inventive concept.

FIG. 13 illustrates a microscope planar view of a laser drilled circular via 410 into a metal substrate 400. The circular blind vias 410 was drilled 175 μm down into a 250 μm thick Molybdenum substrate 400 by ablating 75 continuous circles. Notice that by ablating a circular profile 410 a center pillar 402 is left in the center of the via hole 410. This center pillar 402 will serve as the center pin in the final processed TMV. The outside diameter of the laser drilled via 410 is 70 μm, the center metal conductive pillar 402 is 25 μm, and the width of the laser drilled via 410 or kerf loss is 22.5 μm. One issue with the laser used to cut the via hole 410 in the metal substrate 400 is that the pulse length is about 1.5 nanoseconds. This long pulse length does not fully evaporate the metal, therefore leaving debris 410*db* around the outside perimeter of the laser cut hole 410.

Figure 14:
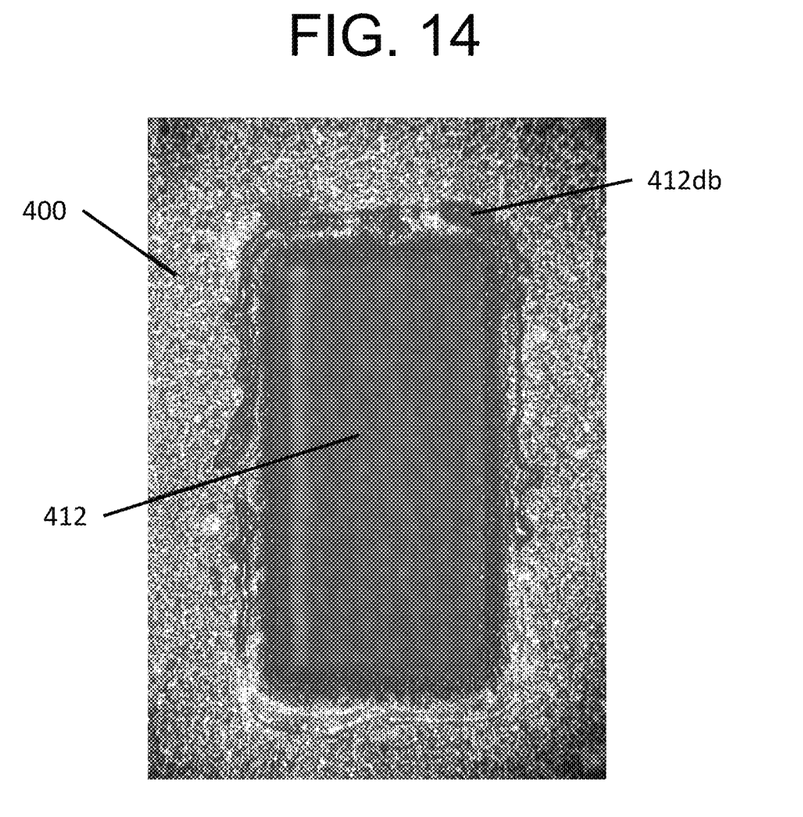
FIG. 14 illustrates a top view of a microscope image of a laser ablated rectangular pocket on a polymer coated metal substrate, according to an example embodiment of the present inventive concept.

FIG. 14 illustrates a top microscope planar view of a laser drilled rectangular pocket 412 in a Molybdenum substrate 400. The pocket 412 was 1.0 mm×0.5 mm and was drilled 125 μm down into the substrate 400 surface. To reduce or eliminate debris 412*db* around the laser cut region 412 the metal substrate 400 surface was pre-coated with a polymer film. A ProtectoLED coating was spun on the surface of the metal substrate 400. The ProtectoLED film is a water-soluble polymer film that is the "Ultimate Surface Protection Coating for Laser Processing". The clear ProtectoLED liquid was spun on the metal substrate 400 at 1,000 rpms for 30 minutes and then followed by a hot plate bake at 95° C. for 5 minutes. FIG. 14 illustrates that even before the ProtectoLED film is removed the laser debris 412*db* is dramatically reduce. To remove the laser debris 412*db* the substrate 400, with the ProtectoLED film, is placed upside down in a DI water bath and ultrasound is used to help the debris 412*db* float loose from the surface of the metal substrate 400.

FIG. 15 illustrates a top view of a laser confocal microscope image of two TMVs connected with a DIP laser etched into the metal wafer. The TMV pins 402 were formed by laser drilling cylindrical cavities 410 down into the metal surface 400. A laser drilled DIP cavity 413 connects the two TMVs. After these three ISSs are fully formed a metal can be deposited across the DIP to connect the two TMV pins 402 forming a delay line or a daisy chain through the metal wafer 400.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A metal substrate comprising:
    a substrate body consisting of a metal;
    at least one in-substrate structure (ISS) formed of the same metal as the metal substrate body and extending into the metal substrate such that ends of the at least one in-substrate structure terminate at a respective plane or planes of surfaces of the metal substrate; and
    a dielectric material disposed between the metal substrate and the at least one in-substrate structure to isolate the at least one in-substrate structure from the metal substrate.

2. The metal substrate according to claim 1, wherein the at least one in-substrate structure includes a through metal via (TMV).

3. The metal substrate according to claim 1, wherein the at least one in-substrate structure includes at least one structure configured to form at least one of an in-substrate plane (ISP), a substrate thermal channel (STC), an in-substrate waveguide (ISW), an in-substrate antenna (ISA), and a substrate integrated passive (SIP).

4. The metal substrate according to claim 1, wherein the dielectric material is selected from a group consisting of: a) a polymer; b) a silicone; c) a glass; d) a ceramic; or any combination of a through d.

5. The metal substrate according to claim 1, further comprising:
    a dielectric material disposed within the metal substrate to form at least one dielectric isolation pocket (DIP); and
    a dielectric material disposed through the metal substrate to form at least one dielectric isolation via (DIV).

6. The metal substrate according to claim 1, further comprising:
    at least one of a through substrate port (TSP), a through substrate channel (TSC) and a substrate integrated microchannel (SIM).

7. The metal substrate according to claim 2, wherein the at least one TMV includes a plurality of electronic pins and a plurality of rectangular and complex shaped metal feedthroughs.

8. The metal substrate according to claim 2, wherein the at least one TMV includes a plurality of TMVs, some of the TMVs being configured to transport electrical signals from one side of the metal substrate to the other side of the metal substrate, some of the TMVs being configured to provide a voltage from one side of the metal substrate to the other side of the metal substrate, and some of the TMVs being configured to provide a ground from one side of the metal substrate to the other side of the metal substrate.

9. The metal substrate according to claim 2, wherein the at least one TMV is configured to provide a coax feedthrough of the metal substrate.

10. The metal substrate according to claim 1, wherein the metal consists of a material selected from a group consisting of: a) Molybdenum; b) Iron; c) Titanium; d) Chromium; e) Tantalum; f) Tungsten; g) Copper; h) Nickel; i) Vanadium; j) Aluminum; k) Cobolt; or any alloy comprised of a) through k).

* * * * *